(12) United States Patent
Dillersberger et al.

(10) Patent No.: US 11,606,024 B2
(45) Date of Patent: Mar. 14, 2023

(54) STARTER CIRCUIT FOR ENERGY HARVESTING CIRCUITS

(71) Applicant: Matrix Industries, Inc., Menlo Park, CA (US)

(72) Inventors: Harald Dillersberger, Graz (AT); Douglas W. Tham, Santa Clara, CA (US)

(73) Assignee: Matrix Industries, Inc., Menlo Park, CA (US)

(*) Notice: Subject to any disclaimer, the term of this patent is extended or adjusted under 35 U.S.C. 154(b) by 0 days.

(21) Appl. No.: 16/992,762

(22) Filed: Aug. 13, 2020

(65) Prior Publication Data

US 2021/0028689 A1     Jan. 28, 2021

Related U.S. Application Data

(63) Continuation of application No. PCT/US2019/017900, filed on Feb. 13, 2019.

(30) Foreign Application Priority Data

Feb. 14, 2018    (DE) .......................... 202018000753.6

(51) Int. Cl.
| | |
|---|---|
| *H02M 1/36* | (2007.01) |
| *H02M 3/338* | (2006.01) |
| *H02M 3/28* | (2006.01) |
| *H01L 35/00* | (2006.01) |
| *H02M 3/335* | (2006.01) |
| *H02M 1/10* | (2006.01) |

(52) U.S. Cl.
CPC .............. *H02M 1/36* (2013.01); *H02M 3/285* (2013.01); *H02M 3/338* (2013.01); *H01L 35/00* (2013.01); *H02M 1/10* (2013.01); *H02M 3/33576* (2013.01)

(58) Field of Classification Search
CPC .......... H02M 1/10; H02M 1/36; H02M 3/285; H02M 3/338; H01L 35/00; H02J 50/001
See application file for complete search history.

(56) References Cited

U.S. PATENT DOCUMENTS

| | | | |
|---|---|---|---|
| 6,108,219 A | 8/2000 | French | |
| 6,340,787 B1 * | 1/2002 | Simeray | ................. G04C 10/00 |
| | | | 136/201 |

(Continued)

FOREIGN PATENT DOCUMENTS

| | | |
|---|---|---|
| DE | 2641860 A1 | 6/1977 |
| DE | 112013005027 B4 | 3/2017 |

(Continued)

OTHER PUBLICATIONS

PCT/US2019/017900 Search Report & Written Opinion dated Apr. 23, 2019.

(Continued)

*Primary Examiner* — Rafael O De Leon Domenech
(74) *Attorney, Agent, or Firm* — Wilson Sonsini Goodrich & Rosati

(57) ABSTRACT

The present disclosure provides a circuits for harvesting energy from an energy source. The energy source may have a first and a second potential of an input voltage. The circuits may further comprise one or more of a charging capacitor, transformers, transistors, or diodes. The circuits may be used for harvesting energy from thermoelectric generators.

11 Claims, 7 Drawing Sheets

(56) References Cited

U.S. PATENT DOCUMENTS

| | | |
|---|---|---|
| 6,775,164 B2 | 8/2004 | Wong et al. |
| 7,667,992 B2 | 2/2010 | Wong et al. |
| 10,390,394 B2 | 8/2019 | Hsia |
| 10,749,428 B1 | 8/2020 | Sengodan |
| 11,070,129 B2 | 7/2021 | Bose et al. |
| 11,362,581 B2 | 6/2022 | Dillersberger |
| 2003/0146767 A1 | 8/2003 | Steele et al. |
| 2003/0146797 A1 | 8/2003 | Atsumi et al. |
| 2005/0041437 A1* | 2/2005 | Chian ................ H02M 3/3381 363/16 |
| 2009/0224803 A1 | 9/2009 | Bernstein et al. |
| 2010/0195360 A1 | 8/2010 | Salerno et al. |
| 2010/0208498 A1 | 8/2010 | Rubio et al. |
| 2013/0182464 A1 | 7/2013 | Woias |
| 2014/0233270 A1 | 8/2014 | Desai et al. |
| 2015/0270784 A1 | 9/2015 | Dillersberger |
| 2017/0012193 A1* | 1/2017 | Jogia ..................... H02J 50/05 |
| 2017/0019107 A1 | 1/2017 | Cho |
| 2017/0063371 A1 | 3/2017 | Dao et al. |
| 2019/0020267 A1* | 1/2019 | Gueissaz ................. H02M 1/36 |
| 2019/0296649 A1 | 9/2019 | Graves |

FOREIGN PATENT DOCUMENTS

| | | |
|---|---|---|
| WO | WO-2016118083 A1 | 7/2016 |
| WO | WO-2019160990 A2 | 8/2019 |
| WO | WO-2019160992 A2 | 8/2019 |

OTHER PUBLICATIONS

Co-pending U.S. Appl. No. 16/856,697, inventor Dillersberger; Harald, filed Apr. 23, 2020.
Co-pending U.S. Appl. No. 16/992,031, inventor Dillersberger; Harald, filed Aug. 12, 2020.
PCT/US2019/017898 Search Report & Written Opinion dated Apr. 23, 2010.
PCT/US2019/017900 International Preliminary Report on Patentability dated Aug. 18, 2020.
PCT/US2019/017898 International Preliminary Report on Patentability dated Aug. 18, 2020.
U.S. Appl. No. 16/992,031 Office Action dated Mar. 24, 2021.
Co-pending U.S. Appl. No. 17/733,466, inventor Dillersberger; Harald, filed Apr. 29, 2022.
EP19754192.3 European search report and opinion dated Jan. 10, 2022.
EP19754284.8 European search report and opinion dated Jan. 14, 2022.
U.S. Appl. No. 16/856,697 Office Action dated Oct. 26, 2021.
U.S. Appl. No. 16/992,031 Notice of Allowance dated Feb. 2, 2022.
U.S. Appl. No. 16/992,031 Office Action dated Oct. 7, 2021.

* cited by examiner

--Prior Art--

STARTER CIRCUIT FOR ENERGY HARVESTING CIRCUITS

CROSS-REFERENCE

This application is a continuation application of PCT International Application No. PCT/US2019/17900, filed Feb. 13, 2019, which application claims priority to German Utility Model Application 202018000753.6, filed on Feb. 14, 2018, which is entirely incorporated herein by reference.

BACKGROUND

A DC-to-DC converter can increase a voltage generated by a voltage source. It may be desirable to know the polarity of the voltage so that the components of the DC-to-DC converter can be connected properly. However, some voltage sources may generate a voltage with one polarity when one set of input conditions is satisfied, but a voltage with an opposite polarity when a second, different set of input conditions is satisfied. For example, a thermoelectric generator may generate a positive voltage when the thermoelectric generator observes a particular temperature gradient, but a negative voltage when it observes an opposite temperature gradient.

SUMMARY

The invention relates to a starter circuit for energy harvesting circuits for an energy source having a first and a second potential of the input voltage. In particular, a thermoelectric generator can be used as an energy source.

Such starter circuits comprise a charging capacitor having a first and a second side, as well as a first and a second transformer each comprising a primary winding and a secondary winding having a winding start and a winding end. In addition, a first and a second starting transistor, a first and a second diode, as well as a first and a second stop transistor are provided.

In this case, the gate terminal of the first starting transistor is coupled to the winding start of the secondary winding of the first transformer, and the drain terminal of the first starting transistor is connected to the winding end of the primary winding of the first transformer. A first oscillator is formed at least by means of the first transformer and the first starting transistor. The first diode is provided between the winding start of the secondary winding of the first transformer and the charging capacitor, wherein the anode of the first diode is connected to the second side of the charging capacitor. The source terminal of the first starting transistor is coupled with the second potential of the input voltage, wherein the first side of the charging capacitor is at the first potential of the input voltage.

Furthermore, the gate terminal of the second starting transistor is coupled with the winding start of the secondary winding of the second transformer, and the drain terminal of the second starting transistor is connected with the winding end of the primary winding of the second transformer. Also here, a second oscillator is formed at least by means of the second transformer and the second starting transistor. The second diode is provided between the winding start of the secondary winding of the second transformer and the charging capacitor, wherein the anode of the second diode is connected with the second side of the charging capacitor. The source terminal of the second starting transistor is coupled with the first potential of the input voltage. Furthermore, at the second side of the charging capacitor, a voltage is generated, which is lower than the first as well as lower than the second potential of the input voltage and can be used to disconnect the first oscillator by means of the first stop transistor and to disconnect the second oscillator by means of the second stop transistor. Thus, the second side of the charging capacitor can also be referred to as the negative side, and the first side can be referred to as the positive side.

Within the context of the invention, "primary winding" or "primary side" of a transformer can be understood to be the winding to which the input voltage is applied, and the secondary winding or secondary side can be understood to be the winding of the transformer at which the output voltage is generated. Within the context of the invention, "coupled" can be understood to be a direct connection, or a connection via one or more components.

A generic starter circuit for an energy source having defined behavior of the first potential with respect to the second potential of the input voltage is known for example from DE 11 2013 005 027 B4. In other words, the polarity of the input voltage must be known. In this case, the starter circuit is used for starting a flyback converter, and the necessary components for the flyback converter have a dual use. This is also the case in the invention.

A flyback converter is also referred to as a buck-boost converter. Said converter is a specific form of a DC-to-DC converter.

A simple basic structure of a flyback converter will now be described with reference to FIG. 6.

The flyback converter of FIG. 6 comprises a voltage source 601, a transformer 603, a diode 606, a charging capacitor 607 and a switch 620. In addition, a capacitor 602 is also provided in parallel with the voltage source 601, but said capacitor is not required for operation as a flyback converter. In this case, the two points on the transformer 603 indicate the winding direction. If reference is made, within the context of the description, to the winding start and end, this is purely in order to aid understanding. In principle it is also possible to swap the terminals in a transformer, provided that the wiring of the coils of the transformer, in opposite direction or same direction, is retained.

The basic operating principle of the flyback converter will be explained in the following. In principle, in the case of a flyback converter two operating modes, the conduction phase and the blocking phase, alternate with one another. The switch 620 determines which type of operation is active. If the switch 620 is closed, the flyback converter is in the conduction phase. If the switch 620 is open, said converter is in the blocking phase.

In the conduction phase, the voltage source 601 causes a current to flow through the primary winding of the transformer 603. Since the diode 606 blocks a current flow through the secondary winding of the transformer 603, said secondary winding is currentless. As a result, a magnetomotive force builds up in the air gap of the transformer 603.

If the switch 620 is then opened, the current flow through the primary winding or side of the transformer 603 stops. Since the current flow through the primary side of the transformer 603 is stopped very rapidly, the current through the secondary side of the transformer 603 increases. The current flows through the diode 606, with the result that the charging capacitor 607 is charged. Subsequently, the switch 620 is closed again and a new cycle, consisting of the conduction phase and the blocking phase, is started.

The pulsing of the switch 620 makes it possible to adjust the power that charges the capacitor 607. As a result, it is possible for example for a load applied to the charging capacitor 607 to be supplied with a specified output voltage, or for an energy store, in particular a rechargeable battery, to be charged with a specified current. In the embodiment of a flyback converter shown here, the input and output are galvanically isolated in each case. This is advantageous, but not essential, and corresponding additional wiring can also allow for operation without galvanic isolation. In the case of the flyback converter shown here, the input voltage can be both greater or smaller than the output voltage. This depends primarily on the control of the switch 620, which switch is preferably formed as a semiconductor switch. Reference is made to a buck or boost operating mode.

The flyback converter can function in discontinuous or in continuous current mode. In the case of continuous current mode, the inductance does still carry a current when the semiconductor switch is turned on. In contrast with a boost converter, in the case of the flyback converter having a corresponding winding ratio it is possible to operate in continuous current mode and at a duty cycle that can be achieved in practice, even in the event of a very high ratio of the output voltage to the input voltage. Using the flyback converter shown here, this is possible for example at an input voltage of 20 mV and at a duty cycle of 75%, up to an output voltage of 6 V. Ignoring the losses which occur, this is calculated according to the following formula:

$$\frac{V_{out}}{V_{in}} = \frac{\tau_{conduction\ phase}}{\tau_{blocking\ phase}} \times N$$

wherein it should be noted that the duty cycle is defined as follows:

$$\text{duty cycle} = \frac{\tau_{conduction\ phase}}{\tau_{conduction\ phase} + \tau_{blocking\ phase}}$$

This means that the ratio of the conduction phase to the blocking phase is 3:1. It is also assumed that a 1:100 transformer is used, wherein N specifies the windings of the secondary side for one winding of the primary side.

Discontinuous current mode can also be referred to as discontinuous conduction mode. In said mode, the current flow through the inductance, i.e. the primary winding of the transformer 603, begins at 0 A. Ignoring the losses which occur, and at a constant input voltage, said current flow reaches a maximum current flow of $I_{max}$ which results as follows:

$$I_{max} = \frac{V_{in} \times \tau_{conduction\ phase}}{L(prim)}$$

wherein $V_{in}$ denotes the input voltage and L(prim) denotes the inductance of the primary winding of the transformer.

The following then results for the input resistance:

$$R_{in} = \frac{2 \times L(prim)}{\tau_{conduction\ phase}^2 \times f}$$

at a switching frequency f:

$$f < \frac{1}{\tau_{conduction\ phase} + \tau_{blocking\ phase}}$$

According thereto, the input resistance is independent of the voltage source. This allows for very simple impedance matching in the case of thermoelectric generators that have a constant output resistance that is independent of the output voltage.

As noted above, the capacitor 602 which is connected in parallel with the voltage source 601 is not essential. However, it is used in this case because the voltage source 601 has an output resistance of greater than zero. As a result, the output resistance of the voltage source 601, together with the capacitor 602, forms a low-pass filter. The result of this is that the input voltage does not drop too much during the conduction phase.

The version of a flyback converter set out with reference to FIG. 6 is a general embodiment in which it is assumed that the switch 620 is controlled by means of an external controller. Integrated flyback converter circuits also exist in which both the semiconductor switch 620 and the controller are provided because this makes the overall solution smaller and more cost-effective. In the conventional flyback converter circuits, no further energy supply is required for said controller.

A slightly modified version of a flyback converter is shown in FIG. 7. In this embodiment of a flyback converter an additional capacitor 727 and a further diode 726 are provided. This structure of the flyback converter allows for rectification of the output voltage by means of a Greinacher circuit.

In this case, during the conduction phase the capacitor 727 is charged, via the diode 726, to the induced voltage of the secondary winding minus a diode voltage. The advantage compared with the flyback converter shown in FIG. 6 is that in this case the diode 706 only has to withstand $V_{out}$ plus a diode voltage.

During the blocking phase the charging capacitor 707 is charged via the diode 706 and the capacitor 727. In this case, the diode 726 is again subjected only to $V_{out}$ plus a diode voltage. The diode 726 may be formed as a Schottky diode for example.

However, as already mentioned, the circuit known from DE 11 2013 005 027 B4 can be used only when it is known, when constructing the circuit, which of the two input potentials of the input voltage is the higher. In order to solve this, US 2010/0208498 A1 for example proposes an antiparallel connection of two DC/DC converters for small positive and negative input voltages.

This is in principle also possible using the circuit known from DE 11 2013 005 027 B4 but, since just one DC/DC converter, i.e. one branch, is used in each case, this would result in the problem of a current flowing through existing self-conducting transistors of the unused branch. This increases the cold-start voltage, reduces the efficiency, and reduces the input resistance of the circuit.

A further problem is that a current flows through the parasitic bulk-drain diode that is present, which current increases exponentially as the input voltage increases. This also reduces the efficiency and reduces the input resistance of the circuit.

In order to solve some of these problems, US 2010/0195360 A1 proposes connecting two self-conducting transistors or semiconductor switches in series in each case. As a result, one of the parasitic diodes is always operated in the reverse direction and no current flows. However, this does not solve the problem resulting from the unused self-conducting transistor. Furthermore, a circuit of this kind is disadvantageous in that the ohmic losses, the input capacitances and the chip area required double while the size of the semiconductor switch remains the same.

An object of the invention is therefore that of specifying a starter circuit for energy harvesting circuits which can be achieved cost-effectively, requires low starting voltages and can be used for thermoelectric generators having a small positive or negative temperature difference.

This object is achieved according to the invention by a starter circuit for energy harvesting circuits having the features of claim 1.

Further advantageous embodiments are specified in the dependent claims, the description, and in the figures and the description thereof.

According to claim 1, a generic starter circuit for energy harvesting circuits is developed in that a partial circuit is provided, which uses the oscillating signal of the first or second oscillator to deactivate the respectively other oscillator.

A basic idea of the invention can be seen in that means are to be provided in the starter circuit in order to deactivate the inactive oscillator.

By means of such a configuration of the starter circuit for energy harvesting circuits, it can be achieved that the circuit can be used independently of whether the first potential or the second potential of the input voltage of the energy source is greater. In other words, the polarity of the energy source would therefore not have to be known. As a result, this circuit is suitable, for example, for use with thermoelectric generators which can be used with both, positive and negative temperature differences.

If the first potential is greater than the second potential of the input voltage, the charging capacitor is charged by means of the first oscillator. In turn, if the second potential of the input voltage is higher than the first, the charging capacitor is charged via the second oscillator.

If, as is correspondingly suggested, a starter circuit having two branches is provided for a positive input voltage and for a negative input voltage, the general problem exists that the unused branch is also supplied with voltage and a current flows, or that the required cold start voltage increases, respectively.

If, in accordance with a conventional construction, a comparator is provided, which identifies which of the two potentials of the input voltage is higher, and thus which polarity the voltage source has, this information can for example be used to correspondingly disconnect the unused branch of the starter circuit, i.e. the branch having the components that are all indicated with "first" or "second", respectively. If, for example, the first potential of the input voltage is higher than the second potential, the second branch is not used and can be disconnected in order to not consume any energy or have other disadvantageous effects on the starter circuit. However, a sufficiently high operating voltage for the comparator would be required. In other words, both branches of the starter circuit would be operated until the operating voltage is present.

According to the invention, it has been found that it is not necessary to provide such a comparator, but rather that it is sufficient to detect which one of the two branches comprises a functioning oscillator. This is because a positive feedback is present in the functioning branch, i.e. the voltage increases if the oscillator is oscillating, whereas a negative feedback exists in the inactive branch and thus merely a current flows, but the oscillator does not oscillate.

Advantageously, the identification as to which oscillator is oscillating can be for example implemented by means of a partial circuit, which comprises a first and a second disconnection diode as well as a first and a second disconnection transistor. In this case, the cathode of the first disconnection diode can be connected to the winding start of the secondary side of the second transformer, and the cathode of the second disconnection diode can be connected to the winding start of the secondary side of the first transformer.

Enhancement NMOS FETs can be used as disconnection transistors, wherein it is advantageous if the source terminal of the first disconnection transistor is connected with the anode of the first disconnection diode, and the source terminal of the second disconnection transistor is connected with the anode of the second disconnection diode. In a corresponding embodiment, the gate terminal of the first disconnection transistor can be at the first potential of the input voltage, and the gate terminal of the second disconnection transistor can be at the potential of the second input voltage.

Such an arrangement achieves that, while the corresponding active oscillator is oscillating, which is used to charge the charging capacitor, the source terminal of the respective other disconnection transistor is at ground, which has the result that the latter disconnects the corresponding starting transistor owing to the further circuitry. In this respect, it is to be understood that the first disconnection diode and the first disconnection transistor receive their energy supply and their trigger signals from the second branch with the second oscillator, whereas the second disconnection diode and the second disconnection transistor receive their signals and energy supply from the first branch with the first oscillator. By this it is achieved that the branch not actively used to charge the charging capacitor can be disconnected by means of the signals of the respectively other oscillator.

Furthermore, the first starting transistor can be coupled to the winding start of the secondary side of the first transformer via a first coupling capacitor, and the second starting transistor can be coupled to the winding start of the secondary side of the second transformer via a second coupling capacitor. With such a configuration with coupling capacitor and an additional resistor provided in the circuit, it is achieved that a long RC constant is present, so that the relatively fast oscillation of the respectively active oscillator is sufficient to not re-activate the starting transistor of the respectively other branch.

In an alternative embodiment, the partial circuit, which detects the oscillator and triggers the disconnection signal for the other oscillator, can be implemented by means of a flip-flop, in particular a D flip-flop. In this case, the advantage compared with the previously described circuit is that the disconnection diodes can be omitted, which diodes must be suitable for relatively high voltages, and thus, in integrated circuits, often have to be configured externally. This increases costs and complicates the production.

The invention further relates to a dual flyback converter circuit which comprises a starter circuit according to the invention for an energy harvesting circuit. In this case, the flyback converter circuit is an example for an energy harvesting circuit. In addition, a first and a second semiconductor switch are provided for operating the flyback converter circuit, wherein the first semiconductor switch is provided between the winding end of the primary winding of the first transformer and the second potential of the input voltage. Analogously thereto, the second semiconductor switch is provided between the winding end of the primary winding of the second transformer and the first potential of the input voltage. In order to operate the flyback converter circuit, a controller is furthermore provided, which controller is supplied with energy by means of the charging capacitor.

Overall, the first transformer, the charging capacitor, the first diode, the first semiconductor switch and the controller form a first flyback converter, and the second transformer, the charging capacitor, the second diode, the second semiconductor switch and the controller form a second flyback converter. In this case, the controller is designed to control both the first and the second semiconductor switch in order to start and operate the flyback converter.

The fundamental operating principle of a flyback converter has already been explained in greater detail with reference to FIGS. 6 and 7. Providing a starter circuit according to the invention for an energy harvesting circuit makes it possible for the dual flyback converter circuit to be supplied with sufficient energy, for starting, in order for the corresponding flyback converter to be started by means of the controller.

According to these embodiments, in principle two flyback converter circuits are provided, wherein just one is used in each case. The flyback converter circuit that is used depends on the relationship between the first and the second potential of the input voltage. Overall, the flyback converter circuits are constructed such that they should each be operated using a positive voltage. In order to ensure this, said circuits are accordingly connected alternately to the first and to the second potential.

In other words, the circuit ensures that only the flyback converter to which a positive input voltage is applied is operated.

The bulk terminals of the first and second semiconductor switch can be connected to the potential of the second side of the charging capacitor, in order to prevent a current through the parasitic diodes of the corresponding semiconductor switch of the unused flyback converter. However, a body effect occurs as a result of the positive source-bulk voltage that is present. For this purpose, for example the source terminals and the second side of the charging capacitor can be grounded.

However, in a further embodiment, the bulk terminals of the first and second semiconductor switch may be connected to the lower potential of the first and of the second potential of the input voltage. This wiring prevents currents from flowing through the parasitic diodes of the corresponding semiconductor switch of the unused flyback converter, and moreover no body effect occurs, and the two semiconductor switches need to be designed only for the absolute value of the difference between the input voltage potentials. In order to detect and achieve this, for example the result of the comparator can be used. In order to implement the circuit in a corresponding manner, two PMOS FETs may be used for this purpose, which PMOS FETs can connect the bulk terminals of the first and second semiconductor switch to the lower of the first and of the second potential of the input voltage in each case.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

In the figures, the same or similar components are denoted by the same reference signs in each case, wherein the first number is different in each case and indicates the figure. In this case, in order to avoid repetition, components having the same function are not necessarily discussed again.

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Figure 1:
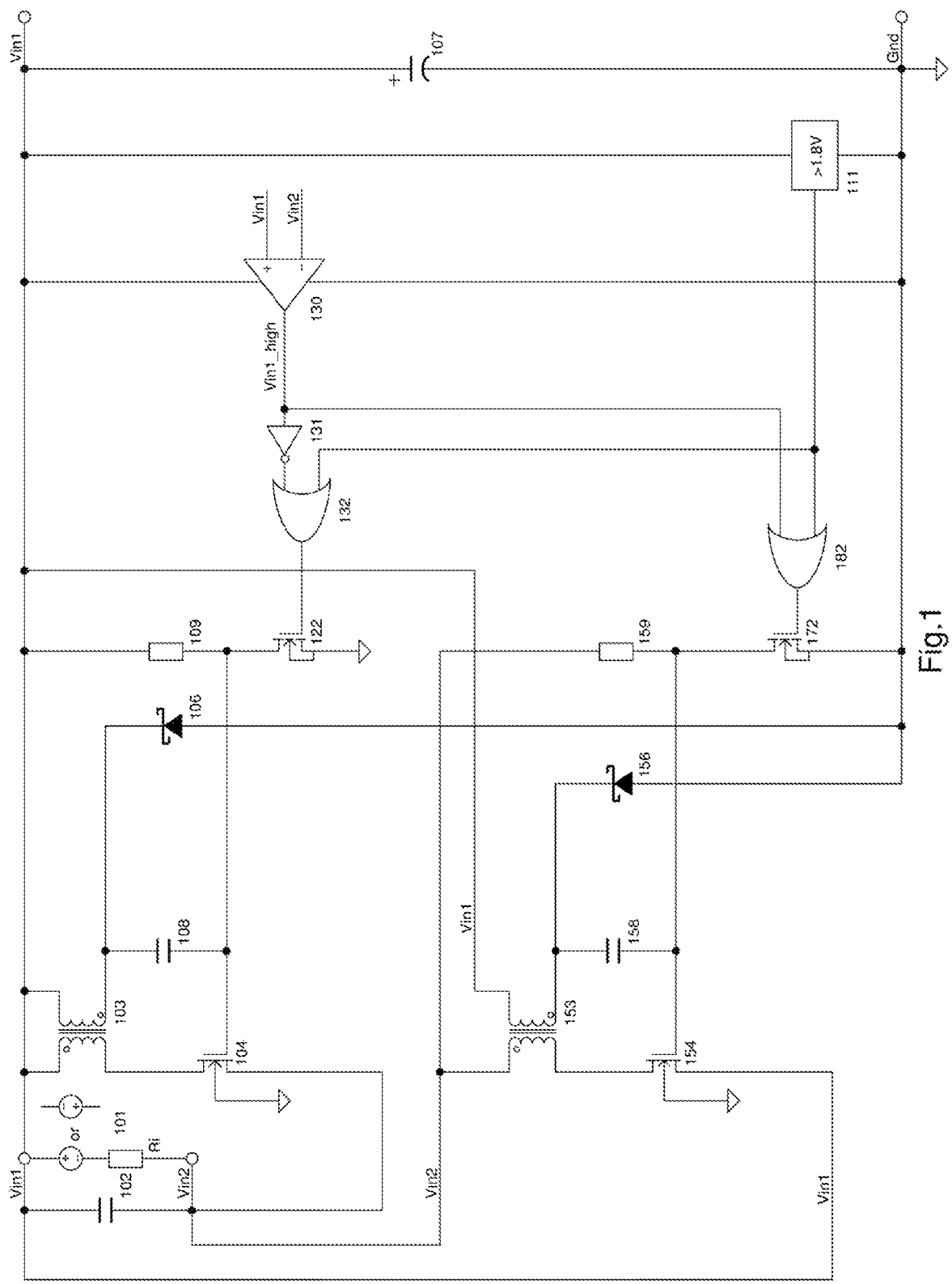
FIG. 1 shows a first embodiment of a starter circuit according to the invention for energy harvesting circuits.

FIG. 1 shows a starter circuit for energy harvesting circuits which comprises two branches in each case. This makes it possible for the starter circuit to function and to charge a charging capacitor 107 irrespective of the ratio of the two potentials of the input voltage of an energy source 101 to one another. In the drawing in FIG. 1, the internal resistance Ri of the DC voltage source 101 is also shown. The DC voltage source 101 may be a thermoelectric generator for example, which generator can operate in conjunction with positive and negative temperature differences. The result of this, as described and also illustrated in FIG. 1, is that the polarity of the voltage source 101 may be different. A capacitor 102 is provided in parallel with the voltage source 101. The effect of said capacitor is the same as that described above with reference to FIG. 6. The first branch of the circuit is formed by a first transformer 103, a first starting transistor 104, a first diode 106, a first coupling capacitor 108, a first resistor 109 and a first stop transistor 122.

The second branch is formed, in an analogous manner, by a second transformer 153, a second starting transistor 154, a second diode 156, a second coupling capacitor 158, a second resistor 159 and a second stop transistor 172.

In addition, a voltage monitoring circuit 111, a comparator 130, two OR gates 132, 182 and an inverter 131 are provided.

The function of the starter circuit will be explained in greater detail in the following.

The substantial difference in the wiring of the two branches is that in the upper branch the winding end of the secondary winding of the first transformer 103 is at the same potential as the winding start of the primary side, specifically at Vin1, whereas the winding end of the secondary winding of the second transformer 153 is at the opposite potential from the winding start of the primary side. The source terminal of the first starting transistor 106 is at Vin2, whereas the source terminal of the second starting transistor 154 is at Vin1. In other words, the winding end of the secondary winding of the relevant transformer 103, 153 is in each case at the same potential as the corresponding source terminal of the starting transistor 104, 154.

The two oscillators are formed in the two branches for the purpose of starting in each case. This is achieved in the first branch by means of the first transformer 103 and the first starting transistor 104, and in the second branch by means of the second transformer 153 and the second starting transistor 154.

The frequency (f) of the oscillator is determined according to:

$$f = \frac{1}{2 \times \pi \times \sqrt{L(\sec) \times C}}$$

wherein in this case C is the sum of the input capacitance of the relevant starting transistor 104, 154 and the capacitance of the secondary side of the relevant transformer 103, 153, and L (sec) is the inductance of the secondary side of the relevant transformer 103, 153.

The operating principle of the starter circuit will be discussed briefly in the following, wherein it is initially assumed that a positive voltage is applied at the voltage source 101 and accordingly Vin1 is greater than Vin2.

As soon as the voltage increases at the voltage source 101, the current in the primary winding of the first transformer 103 increases, and at the same time a voltage is induced in the secondary winding of the first transformer 103, which voltage increases the gate voltage at the first starting transistor 104. As a result, the first starting transistor 104 has a lower resistance and the current can increase further. The voltage applied to the primary winding reduces on account of the ohmic voltage drops, and as a result the voltage at the gate of the first starting transistor 104 reduces, said starting transistor becomes higher-resistance, and this causes a further reduction in the voltage at the primary winding. This subsequently results in a negative gate voltage at the first starting transistor 104, which transistor disconnects at the threshold voltage thereof. As already described for the flyback converter, the current can then only continue to flow into the secondary side of the first transformer 103. As a result the charging capacitor 107 is charged to a low voltage. This charging takes place via a first diode 106, such that the energy with which the capacitor 107 has been charged can no longer drain out. The current in the secondary winding of the first transformer 103 now drops to zero, the gate voltage at the first starting transistor 104 is also 0 V, and the current in the primary winding of the first transformer 103 begins to increase again. The periodic current pulses charge the charging capacitor 107 to an ever higher voltage.

In summary, the branch having a positive input voltage experiences positive feedback, by means of an oscillator, and begins to oscillate even at very low input voltages of less than 10 mV. The opposite wiring results in negative feedback in the other branch in which a negative input voltage is applied, as a result of which negative feedback a constant current through the relevant primary winding of the transformer 103, 153 develops. This is not desired, and is prevented, as will be described in more detail below.

Depending on the particular polarity of the voltage source 101, the first diode 106 or the second diode 156 charges the negative potential on the charging capacitor 107 to a voltage of less than Vin1. Since, after the circuit has been started up, the output voltage—Vin1 relative to ground—is larger, in terms of amount, than the input voltage—the total of Vin1 minus Vin2—ground is always less than Vin1, also irrespective of the relevant polarity. As a result, ground can be used in order to disconnect the respective starting transistors 104, 154 and thus to stop the relevant oscillator.

The comparator 130 is provided in order to deactivate precisely the branch which, as described above, operates with negative feedback and has an undesired constant current through the primary winding of its relevant transformer 103, 153 thereof, by means of disconnecting the starting transistors 104, 154.

Said comparator detects whether Vin1 is greater than Vin2. If this is the case, said comparator applies the signal Vin1 high to Vin1, otherwise applies to ground. In the first case, i.e. when Vin1 is greater than Vin2, the output of the OR gate 182 is logical 1 and connects Vin1 over to the stop transistor 172. As a result, said stop transistor becomes low-resistance and thus the gate of the second starting transistor 154 is connected to ground potential, with the result that the second starting transistor 154 becomes high-resistance.

In the opposite case, i.e. if Vin2 is greater than Vin1, Vin1 high is connected to ground, and therefore, as a result of the inverter 131, the output of the OR gate 132 connects to logical 1, i.e. Vin1, and accordingly, in an analogous manner, the first starting transistor 104 is disconnected via the first stop transistor 122. This functionality prevents current from flowing through the unused transformer 103, 153 of the unused branch.

The voltage monitoring circuit 111 is provided for disconnecting the used branch, i.e. the oscillator present therein, when a desired voltage is reached at the charging capacitor 107. Said monitoring circuit may for example consist of a reference voltage source, a resistance divider and a comparator. However, in this case it is essential that said monitoring circuit should identify a voltage of 1.8 V at the charging capacitor 107 in the embodiment according to FIG. 1. This results in said monitoring circuit actuating the stop transistor 122, 172 of the used branch accordingly, by means of the two OR gates 132, 182, in order to now also disconnect the starting transistor 104, 154 of the relevant branch.

It is essential in this embodiment that the bulk terminals of the starting transistors 104, 154 are at ground potential. As will be described in the following, this prevents a current from being able to flow through the parasitic bulk-drain diode. As described above, ground is less than Vin1 and Vin2 during operation. As a result, no current can flow through the two above-described parasitic bulk-drain diodes at the two starting transistors 104, 154. This significantly increases the efficiency of the circuit without the need for further components.

However, connecting the bulk terminals to ground results in a disadvantage, in formal terms, in that a body effect occurs. A body effect is the increase in the threshold voltage in the case of a positive source-bulk voltage. The impact of said effect is only minor in the case of the small output voltages present here, and therefore the circuit is well suited for charging the charging capacitor 107 accordingly, and thus supplying a downstream energy harvesting circuit with sufficient energy to start up.

A development of FIG. 1 will now be set out and described with reference to FIGS. 2 and 3. In this case it should be noted that, although the bulk terminals of the starting transistors 204, 304, 254, 354 are at ground in each case, although this increases the efficiency of the circuit, as described above with reference to FIG. 1, it is not essential.

The comparator 130 from FIG. 1 only functions above a threshold voltage of the transistors used therefor. As a result, a further voltage monitoring circuit, for example for a voltage of 1 V, would in principle be necessary, which monitoring circuit ensures that the outputs of the comparator 130 as well as of the inverter 131 initially remain at the ground potential beforehand, and furthermore increases the cold-start voltage of the entire circuit as a result, because current flows in the unused transformer 103, 153 until the threshold voltage, for example of 1 V, is reached.

Figure 2:
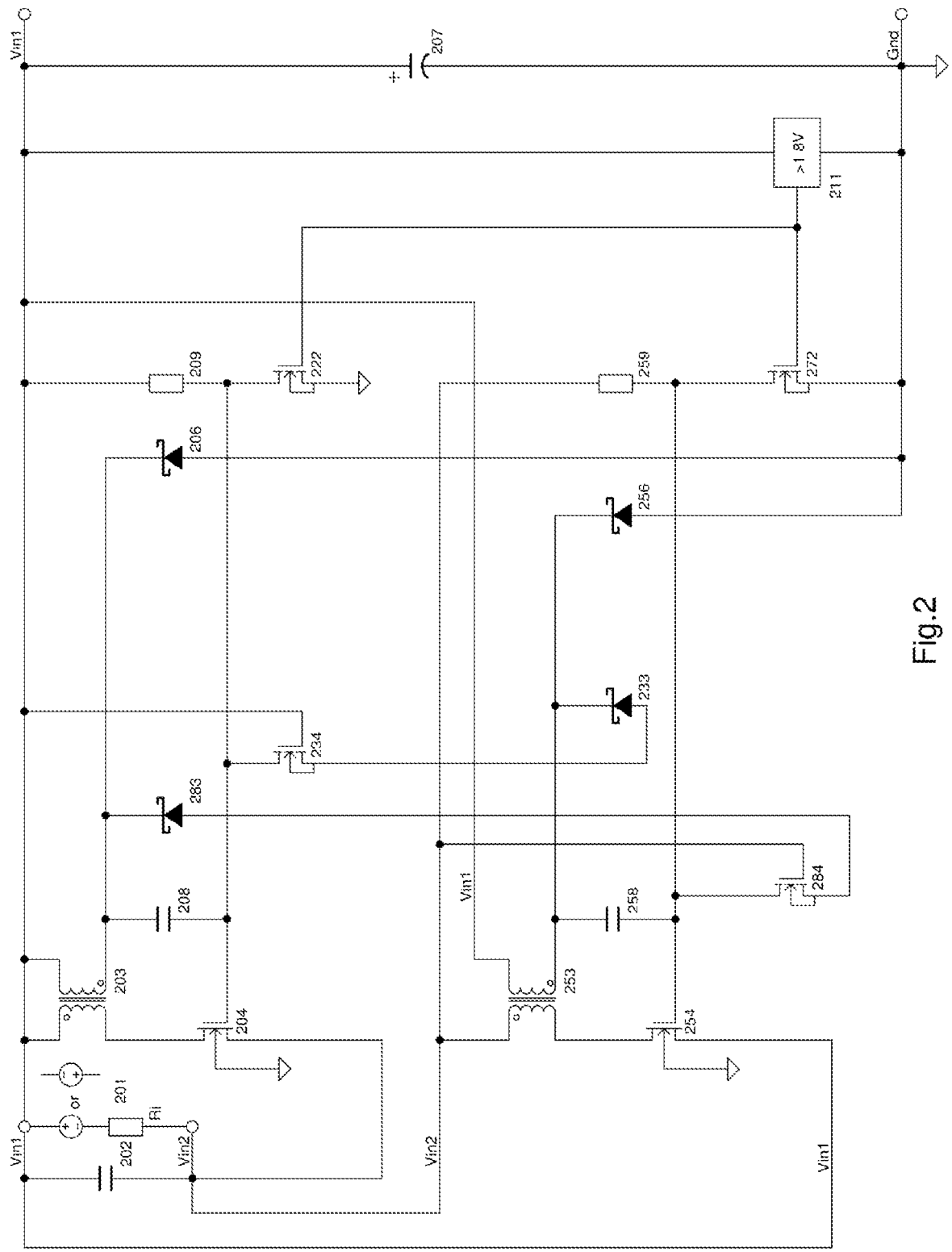
FIG. 2 shows a second embodiment of a starter circuit according to the invention for energy harvesting circuits.
Figure 3:
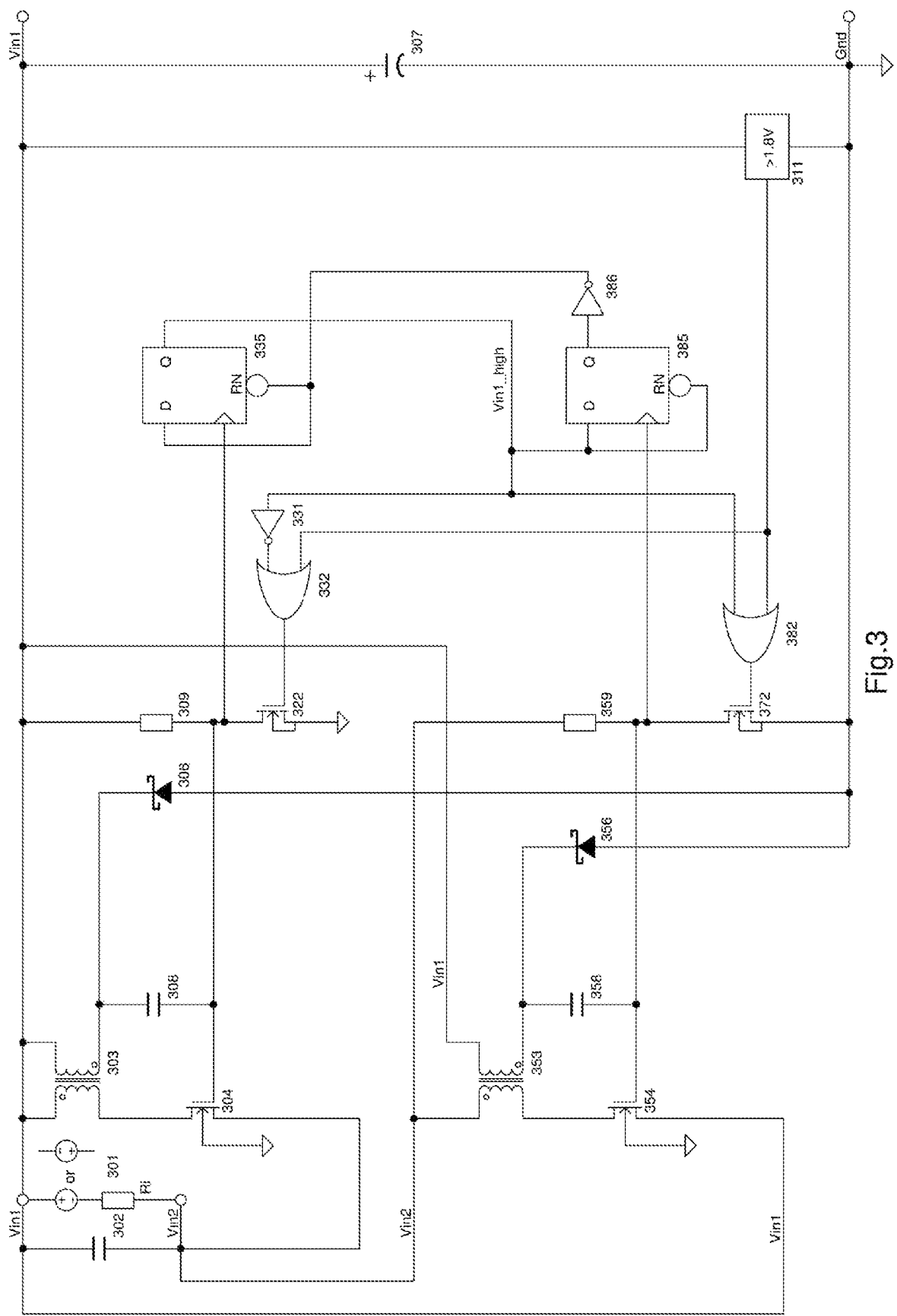
FIG. 3 shows a third embodiment of a starter circuit according to the invention for energy harvesting circuits.

This is improved in the embodiment according to FIGS. 2 and 3. In this case, in both circumstances the oscillating signal of the oscillating or operating branch is used to deactivate the inoperative branch as early as possible. The branch referred to as the operating branch is the branch in which the oscillator functions as desired and positive feedback is present.

In FIG. 2, a disconnection diode 233, 283 and a disconnection transistor 234, 284 are provided for each branch, in place of the comparator 130, the OR gate 132, 182 and the inverter 133. In this case, the cathode of the first disconnection diode 233 is connected to the winding start of the secondary side of the second transformer 253. The second disconnection diode 283 is connected, in an analogous manner, to the first transformer 203. Schottky diodes are preferably used as the disconnection diodes 233, 283.

The embodiment according to FIG. 2, and subsequently also according to FIG. 3, will be described in the following on the basis of the assumption that Vin2 is greater than Vint. This means that the second branch of the starter circuit is operating, which branch is shown at the bottom of the figures. In this connection, "operating" can be understood to mean that the second oscillator, which is formed by the second transformer 253 and the starting transistor 254, oscillates. Accordingly, the charging capacitor 207 is charged, via the second diode 256, by means of the energy in the secondary winding of the second transformer 253. This always takes place at the time at which the voltage at the winding start of the secondary winding of the second transformer 253 is below the ground potential by more than the forward voltage of the second diode 256.

In the following, the forward voltage of the second diode 256, which is designed as a Schottky diode, is assumed to be 300 mV.

While the second oscillator oscillates, in the relevant recurrent phase, in which phase the cathode of the second diode 256 is at a value of 300 mV below the ground potential, the cathode of the second disconnection diode 233 is also at said potential. As a result, assuming that the voltage drop across the disconnection diode 233 and the second diode 256 is the same, the source terminal of the disconnection transistor 234 is also at ground. If the resistor 209 is high-resistance, for example in the region of ≥10 MΩ, the current through the disconnection diode 233 is less than the current through the second diode 256. As a result, provided that the disconnection diode 233 and the second diode 256 are identical in design, the voltage drop across the disconnection diode 233 is less than across the second diode 253. The source terminal of the disconnection transistor 234 is therefore even below the ground potential.

As soon as the gate-source voltage of the disconnection transistor 234 reaches the threshold voltage thereof, said disconnection transistor becomes low-resistance. This results in the gate voltage of the starting transistor 204 being drawn to or, depending on the exact design, below, the ground potential. Thereupon, the starting transistor 204 becomes high-resistance, as a result of which the oscillator of the unused branch is disconnected.

In practice, this effect functions even below the threshold voltage, i.e. in the weak inversion of the disconnection transistor 243, because said transistor has to be low-resistance only compared with the resistor 209.

While the oscillator formed by the second transformer 253 and the second starting transistor 254 is oscillating, the gate voltage of the first starting transistor 204 is briefly pulled down, i.e. reduced. However, the long time-constant of the RC element, which is formed by the resistor 209 and the coupling capacitor 208, means that the voltage always remains low enough, during the operation of the second branch, for the first starting transistor 204 to remain disconnected. The RC time constant is usually significantly more than a period of the oscillating oscillator.

The mode of operation of said circuit, when Vin1 is greater than Vin2, is the analogous operating principle, wherein the oscillator oscillates in a first branch which is formed by the first transformer 203 and the first starting transistor 204, whereas the second branch is disconnected.

An advantage of this circuit compared with the above-described circuit is that the unused branch can already be deactivated significantly below the threshold voltage of an NMOS FET. It is thus possible to achieve cold-start voltages of below 20 mV.

In a manner corresponding to the embodiment of the starter circuit described in FIG. 3, the disconnection diodes 333, 383 can be omitted, which is positive because the dimensions of said disconnection diodes have to be designed for the maximum possible highest voltage. Furthermore, the disconnection mechanism according to FIG. 2 functions only as long as the other branch is still active.

In the starter circuit according to FIG. 3, two D flip-flops having an asynchronous active-low reset input 335, 385, as well as an inverter 386, are provided in place of the comparator 130 from FIG. 1. Said components form an edge triggered set-reset flip-flop.

In this case, it is essential the output of the first flip-flop 335 to be able to be set to logical 1 by means of a positive edge at the clock input thereof. This is equal to Vin1 according to the embodiment according to FIG. 3. Furthermore, said flip-flop can be reset again, i.e. to logical 0, which is ground according to the embodiment according to FIG. 3, by means of a positive edge at the clock input of the second D flip-flop 385. In principle, other wiring configurations of logic gates having this functionality are of course also possible.

It is again assumed in the following that Vin2 is greater than Vin1. In the embodiment shown here, the gate voltage at the second starting transistor 354 oscillates, whereas the gate voltage at the first starting transistor 304 is at Vin1, owing to the resistor 309. The gate voltage at the second starting transistor 354, which is also applied at the clock input of this second D flip-flop 385, has an amplitude which usually exceeds the supply voltage limits of said second D flip-flop 385. Said voltage is therefore suitable for detecting the oscillating signal.

When said starter circuit is started, the unspecified state of the D flip-flop 335, 385 means that two situations should in principle be taken into account.

After the starter circuit has been started, Vin1 high is at logical 1. This means that the voltage therein is Vin1. As soon as the supply voltage is sufficient for the illustrated combination of the D flip-flop 335, 385, the Q output is set to logical 1 of a rising edge at the clock input of the second D flip-flop 385. Said rising edge is generated by the second oscillator which oscillates in the lower branch. Setting the Q output of the second D flip-flop 385 results in logical 0 being applied at the RN input of the first D flip-flop 335 by means of the inverter 386. Therefore, the Q output of said first flip-flop 335 is also logical 0, which now corresponds to Vin1 high. Therefore, logical 0 is also applied at the RN input of the second D flip-flop 385, with the result that the Q output of said flip-flop is also connected to logical 0. Owing to the inverter 386, logical 1 is now applied both at the D input and at the RN input of the first D flip-flop 335, with the result that a stable state is achieved.

The second alternative is for Vin1 high to be at logical 0, which corresponds to ground, after the starter circuit has been started. This is already the correct state, and therefore nothing else changes.

The inverter 331 and the OR gate 332 now set the gate of the first starting transistor 304 to ground by means of the first stop transistor 322, with the result that the first oscillator can be deactivated as early as possible.

If Vin1 is greater than Vin2, the same control system comes into force in an analogous manner for the second branch of the starter circuit.

An advantage of this embodiment is that, since the flip-flops do not have to power a static load, and the respective stop transistors 322, 372 carry only a very small current through the relevant upstream high-resistance resistor 309, 359, said circuit can in turn deactivate the unused branch significantly below the threshold voltage of an NMOS FET. It is thus likewise possible to achieve a cold-start voltage of below 20 mV.

A further advantage of said embodiment is that the signaling lines used are connected to the gates of the starting transistors 304, 354 and surge protection is therefore already provided. As soon as the starter circuit is no longer operating and the two oscillators are disconnected, the corresponding inputs of the D flip-flop 355, 385 are connected to ground via the two stop transistors 322, 372, in normal operation, and thus also protected from high voltages.

An advantage of the embodiment shown here and of connecting the two D flip-flops 335, 385 to the inverter 386 is that the state of Vin1 high is stored in the first D flip-flop 335 even on a disconnection of both branches.

Figure 4:
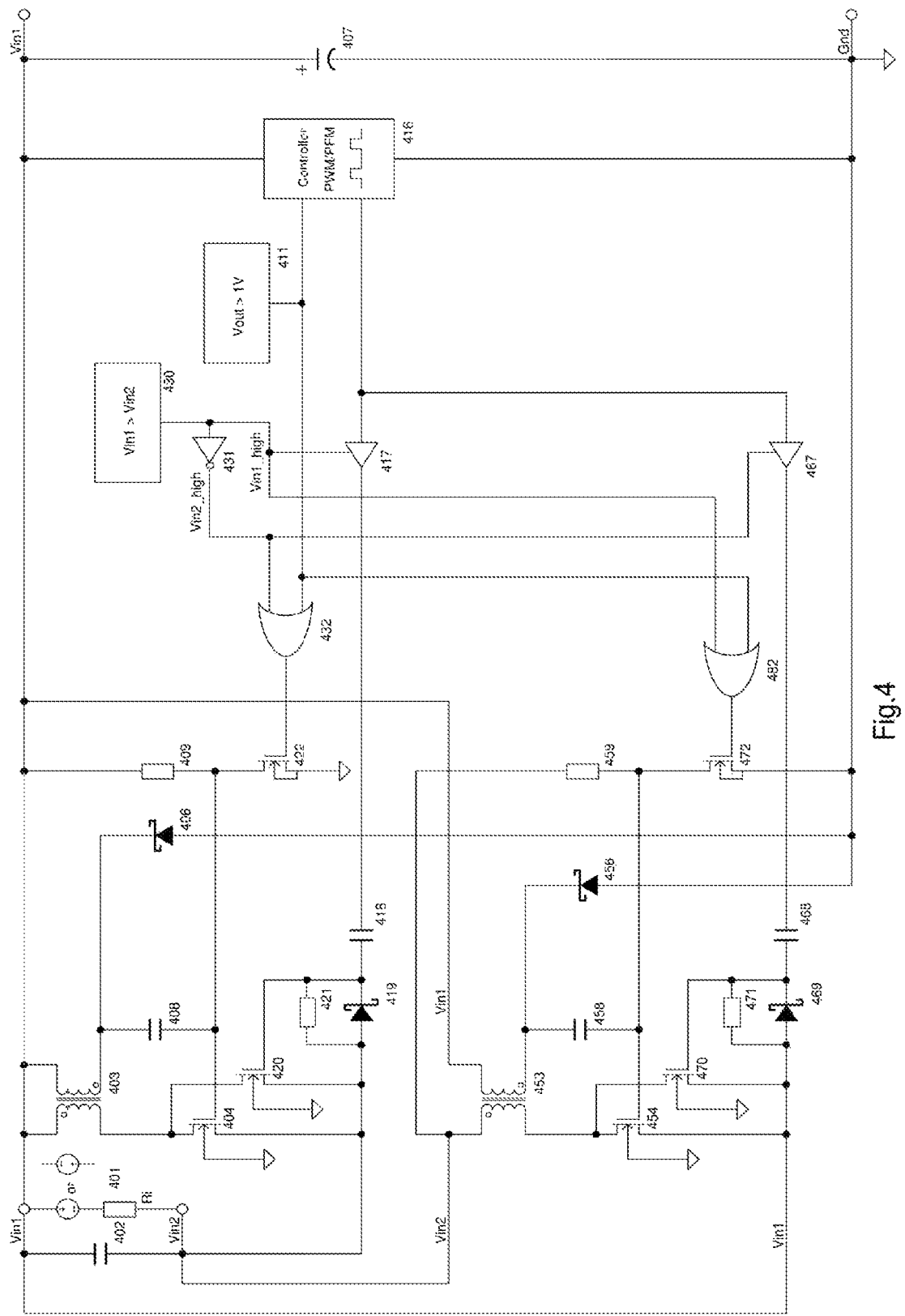
FIG. 4 shows a dual flyback converter circuit according to the invention.

FIG. 4 shows the above-described starter circuit from FIG. 1 in conjunction with two flyback converter circuits, wherein the flyback converter circuits in the respective branches are designed in a similar manner to that in DE 11 2013 005 027 B4, described above. In detail, for this purpose a semiconductor switch 420, a resistor 421, a diode 419 as well as a coupling capacitor 418 are additionally provided for the first, upper branch.

The same components, i.e. a second semiconductor switch 470, a second resistor 471, a second diode 469 and a second coupling capacitor 468 are also provided in the second branch.

Figure 6:
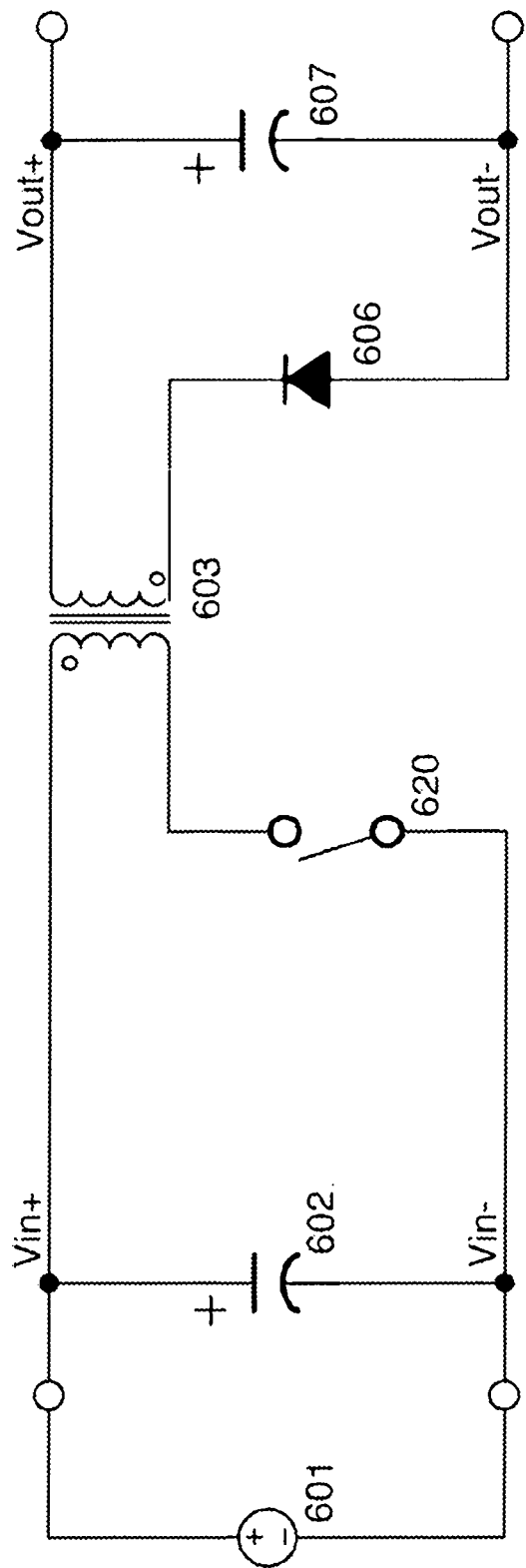
FIG. 6 shows an example of a flyback converter.
Figure 7:
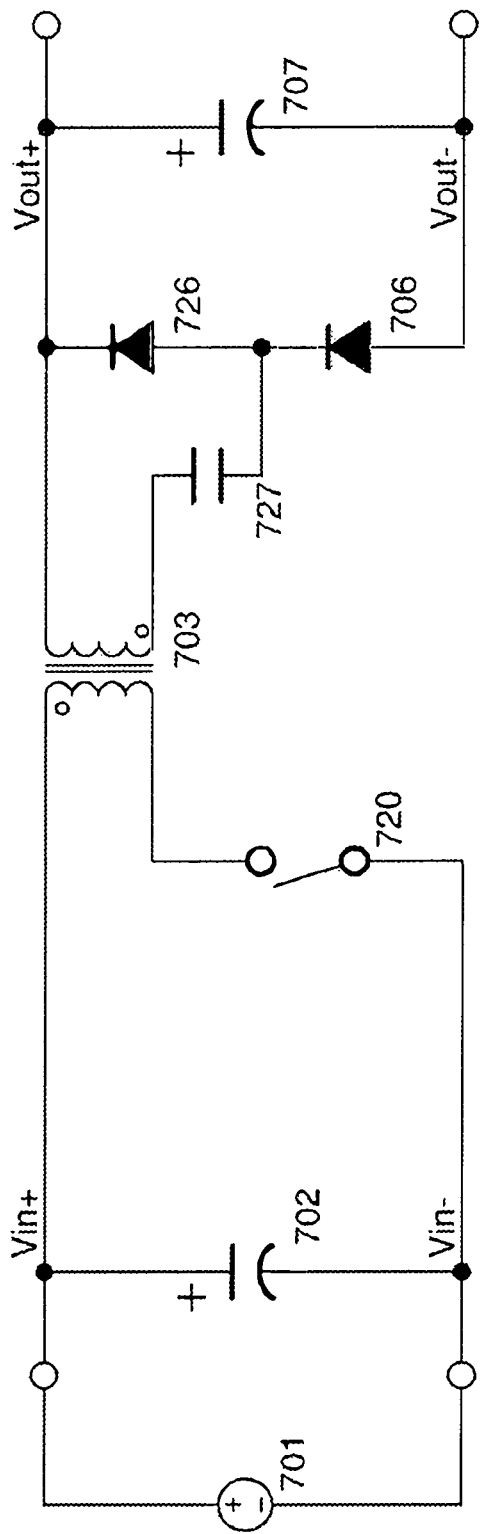
FIG. 7 shows a further example of a flyback converter.

With regard to the fundamental operating principle of a flyback converter, reference is made to the above description provided with reference to FIGS. 6 and 7.

A controller 416 is additionally provided in this circuit, for controlling the two flyback converters, wherein, as described in the following, in each case one flyback converter is operated actively and the other remains disconnected. The comparator 430 for identifying which of the two input polarities of the input voltage is higher may for example be the comparator 130 from FIG. 1 or the circuit as is described in FIG. 3. The voltage detector 411 is used for disconnecting the starting oscillator that is still active, and also for putting the controller 416 into operation only when there is a sufficiently high voltage.

The way in which it is possible to in each case operate just one of the two starting oscillators and subsequently to disconnect the second when a sufficiently high voltage is applied to the charging capacitor 407 has already been described above. In conjunction with the signal of the comparator 430 and the two drivers 417 and 467, the controller 416 in each case operates only the flyback converter that can be operated using a positive input voltage. If the comparator identifies, for example, that Vin1 is greater than Vin2, the first driver 417 is active whereas the second driver 467 is not active, and thus the signals of the controller 416 are not forwarded to the flyback converter provided in the second, lower, branch. Said converter is therefore not operated.

In said circuit, no currents flow through the parasitic diodes of the two semiconductor switches 420, 470 because the bulk terminals thereof are at ground.

Figure 5:
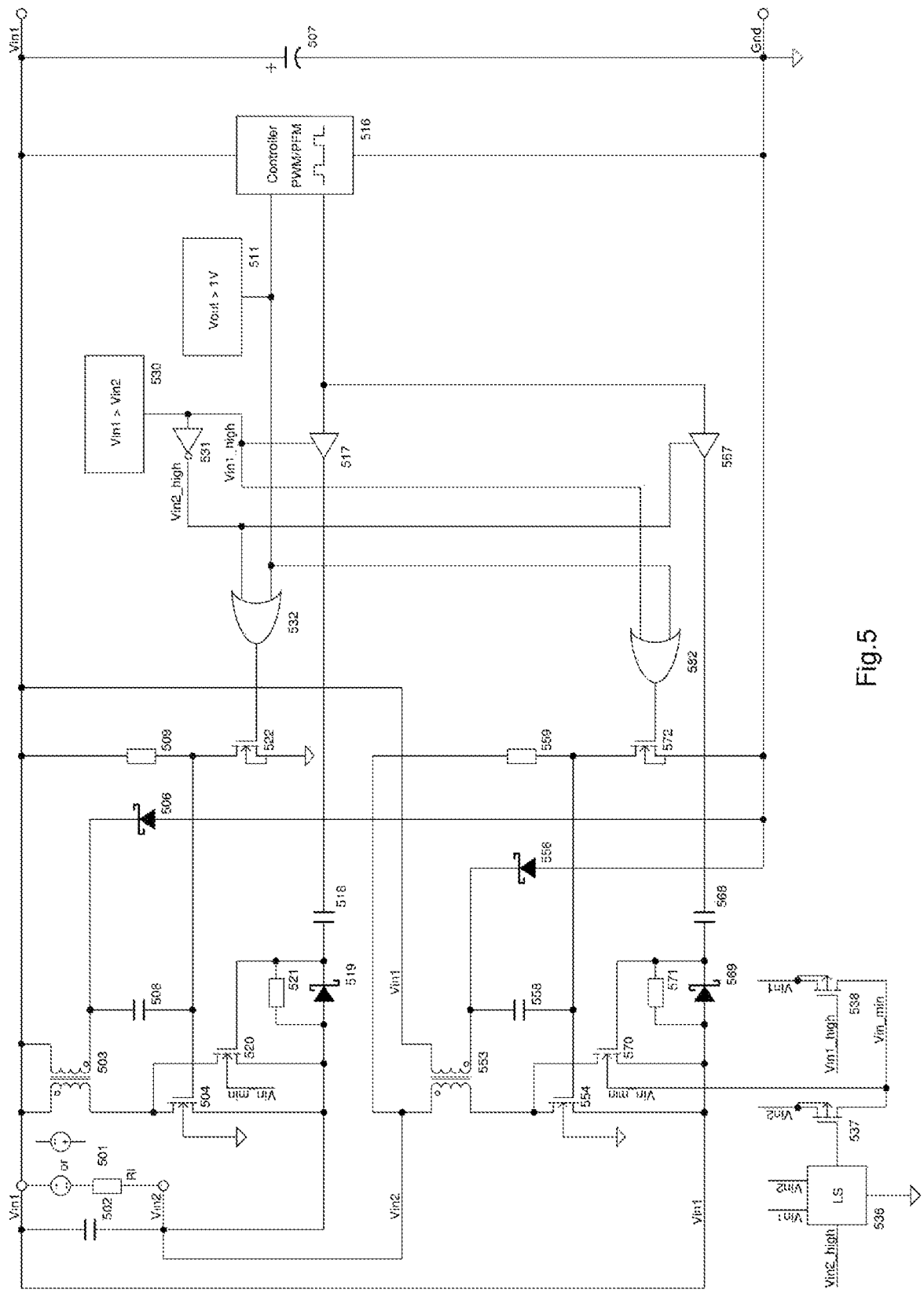
FIG. 5 shows a dual flyback converter circuit according to the invention.

The embodiment according to FIG. 5 is based on the above-described dual flyback converter circuit from FIG. 4. In FIG. 4, the bulk terminals of the two semiconductor switches 420, 470 are connected to ground in order to prevent a current through the parasitic diodes of the corresponding semiconductor switch 420, 470 of the unused flyback converter. However, a body effect occurs as a result of the positive source-bulk voltage that is present.

In said circuit, the bulk terminals of the semiconductor switches 520, 570 are in each case connected to the lower potential of the two input voltage potentials, denoted Vin_min. For this purpose, in accordance with the circuit from FIG. 5 the higher input voltage potential is in turn detected by the comparator 530. The signal Vin1 high or Vin2 high that is at ground potential, i.e. indicates that this is the lower input potential, connects one of the two PMOS FETs 537, 538 that are provided, and in turn connects Vin_min to the lower potential.

In addition, a level shifter 536 is required for the gate actuation of the transistor 537, since the logic gate is supplied with power by Vin1 and ground. The purpose of the level shifter 536 is that no current can flow when the transistor 537 is disconnected. It is also not a problem that the circuit can be operated only above approximately 1 V, because the flyback converter can also be actively controlled and started up only at this point.

An advantage of this circuit is that no currents flow through the parasitic diodes, and furthermore no body effect occurs. Furthermore, the two semiconductor switches 520, 570 only have to be designed for the magnitude of the difference between the input voltage potentials of the voltage source 501.

In principle, this circuit can also be used for small AC voltages of a low frequency in the region of at most 1 kHz. This is possible provided that the switching frequency of the controller 516 is significantly higher than the frequency of the AC voltage.

The solution described herein makes it possible to specify a starter circuit for an energy harvesting circuit which can be achieved cost-effectively, requires a low starting voltage and can be used for thermoelectric generators having a small positive or negative temperature difference.

What is claimed is:

1. A starter circuit for energy harvesting circuits for an energy source having a first and a second potential of an input voltage having:
    a charging capacitor (207, 307, 407, 507) which has a first and a second side,
    a first and a second transformer (203, 303, 403, 503, 253, 353, 453, 553) each comprising a primary winding and a secondary winding having a winding start and a winding end,
    a first and a second starting transistor (204, 304, 404, 504, 254, 354, 454, 554),
    a first and a second diode (206, 306, 406, 506, 256, 356, 456, 556) as well as a first and a second stop transistor (222, 322, 422, 522, 272, 372, 472, 572),
    wherein a gate terminal of the first starting transistor (204, 304, 404, 504) is coupled with the winding start of the secondary winding of the first transformer (203, 303, 403, 503) and a drain terminal of the first starting transistor is connected to the winding end of the primary winding of the first transformer (203, 303, 403, 503),
    wherein a first oscillator is formed at least by the first transformer (203, 303, 403, 503) and the first starting transistor (204, 304, 404, 504),
    wherein the first diode (206, 306, 406, 506) is provided between the winding start of the secondary winding of the first transformer (203, 303, 403, 503) and the charging capacitor (207, 307, 407, 507),
    wherein an anode of the first diode (206, 306, 406, 506) is connected to the second side of the charging capacitor (207, 307, 407, 507),
    wherein a source terminal of the first starting transistor (204, 304, 404, 504) is coupled with the second potential of the input voltage,
    wherein the first side of the charging capacitor (207, 307, 407, 507) is at the first potential of the input voltage,
    wherein a gate terminal of the second starting transistor (254, 354, 454, 554) is coupled with the winding start of the secondary winding of the second transformer (253, 353, 453, 553) and a drain terminal of the second starting transistor is connected to the winding end of the primary winding of the second transformer (253, 353, 453, 553),
    wherein a second oscillator is formed at least by the second transformer (253, 353, 453, 553) and the second starting transistor (254, 354, 454, 554),
    wherein the second diode (256, 356, 456, 556) is provided between the winding start of the secondary winding of the second transformer (253, 353, 453, 553) and the charging capacitor (207, 307, 407, 507),
    wherein an anode of the second diode (256, 356, 456, 556) is connected to the second side of the charging capacitor (207, 307, 407, 507),
    wherein a source terminal of the second starting transistor (254, 354, 454, 554) is coupled with the first potential of the input voltage,
    wherein a voltage is generated on the second side of the charging capacitor (207, 307, 407, 507), which voltage is below the first and below the second potential of the input voltage and can be used for disconnecting the first oscillator by means of the first stop transistor (222, 322, 422, 522) and for disconnecting the second oscillator by means of the second stop transistor (272, 372, 472, 572),
    and wherein a partial circuit is provided which uses an oscillating signal of the first or second oscillator to deactivate the other oscillator.

2. The starter circuit for an energy harvesting circuit according to claim 1, wherein the partial circuit has a first and a second disconnection diode (233, 283) and a first and a second disconnection transistor (234, 284).

3. The starter circuit for an energy harvesting circuit according to claim 2, wherein a cathode of the first disconnection diode (233) is connected to the winding start of the secondary winding of the second transformer (253) and that a cathode of the second disconnection diode (283) is connected to the winding start of the secondary side of the first transformer (203).

4. The starter circuit for an energy harvesting circuit according to claim 2,
    wherein enhancement NMOS FETs are used as disconnection transistors (234, 284), and
    wherein a source terminal of the first disconnection transistor (234) is connected to an anode of the first disconnection diode (233) and a source terminal of the second disconnection transistor (284) is connected to an anode of the second disconnection diode (283).

5. The starter circuit for an energy harvesting circuit according to claim 2,
    wherein a gate terminal of the first disconnection transistor (234) is at the first potential of the input voltage, and
    wherein a gate terminal of the second disconnection transistor (284) is at the second potential of the input voltage.

6. The starter circuit for an energy harvesting circuit according to claim 1,
    wherein the first starting transistor (204) is coupled via a first coupling capacitor (208) with the winding start of the secondary side of the first transformer (203), and
    wherein the second starting transistor (254) is coupled via a second coupling capacitor (258) with the winding start of the secondary side of the second transformer (253).

7. The starter circuit for an energy harvesting circuit according to claim 1, wherein the partial circuit is implemented by flip-flops (335, 385).

8. The starter circuit for an energy harvesting circuit according to claim 1, comprising:
    a first and a second semiconductor switch (420, 520, 470, 570), wherein the first semiconductor switch (420, 520) is provided between the winding end of the primary winding of the first transformer (403, 503) and the second potential of the input voltage,
    wherein the second semiconductor switch (470, 570) is provided between the winding end of the primary winding of the second transformer (453, 553) and the first potential of the input voltage, wherein a controller (416, 516) is provided, which is supplied with energy by means of the charging capacitor (407, 507), wherein the first transformer (403, 503), the charging capacitor (407, 507), the first diode (406, 506), the first semiconductor switch and the controller (416, 516) form a first flyback converter, wherein the second transformer (453, 553), the charging capacitor (407, 507), the second diode (456, 556), the second semiconductor switch (470, 570) and the controller (416, 516) form a second flyback converter, and wherein the controller (416, 516) is formed to control the first and second semiconductor switches (420, 520, 470, 570) after the start of the first or second flyback converter.

9. The starter circuit for an energy harvesting circuit according to claim 8, wherein:

a first driver (417, 517) and a second driver (467, 567) are provided, wherein only the first or second flyback converter is operable by means of the result of a comparator (430, 530) and of the first and the second driver (417, 517, 467, 567), in which the beginning of the primary winding of the transformer (403, 503, 453, 553) is connected to a higher potential of the first and the second potential of the input voltage.

10. The starter circuit for an energy harvesting circuit according to claim 8, wherein a bulk terminal of the first and the second semiconductor switch (420, 520, 470, 570) is at the lower potential of the first and the second potential of the input voltage or at the potential of the second side of the charging capacitor (407, 507).

11. The starter circuit for an energy harvesting circuit according to claim 8, wherein a bulk terminal of the first and the second semiconductor switch (520, 570) is switchable to the lower potential of the first and the second potential of the input voltage by means of the result of a comparator (530) and two PMOS FETs (537, 538).

* * * * *